United States Patent [19]
Ko et al.

[11] Patent Number: 5,736,772
[45] Date of Patent: Apr. 7, 1998

[54] BIFURCATED POLYSILICON GATE ELECTRODES AND FABRICATION METHODS

[75] Inventors: Young-Wi Ko; Yun-Jin Cho, both of Seoul; Sung-Hee Cho; Hyong-Gon Lee, both of Kyungki-do, all of Rep. of Korea

[73] Assignee: Samsung Electronics Co., Ltd., Suwon, Rep. of Korea

[21] Appl. No.: 633,450

[22] Filed: Apr. 17, 1996

[30] Foreign Application Priority Data

Apr. 27, 1995 [KR] Rep. of Korea ............... 1995-10174

[51] Int. Cl.⁶ .................................................. H01L 29/423
[52] U.S. Cl. .................... 257/412; 257/364; 257/365; 437/189; 437/193
[58] Field of Search ............................. 257/412, 364, 257/365; 437/186, 187, 191, 193, 233, 245

[56] References Cited

U.S. PATENT DOCUMENTS 5,378,913  1/1995  Hoeltge ........................... 257/364
5,581,105  12/1996  Huang ............................ 257/412

FOREIGN PATENT DOCUMENTS 0276762  11/1989  Japan ............................. 257/364

Primary Examiner—Tom Thomas
Assistant Examiner—David B. Hardy
Attorney, Agent, or Firm—Myers Bigel Sibley & Sajovec

[57] ABSTRACT

A polysilicon gate electrode of an integrated circuit field effect transistor is formed in two portions which are isolated from one another. The first portion is formed on the gate insulating region. The second portion is formed on the semiconductor substrate outside the gate insulating region and is electrically insulated from the first portion. Since the first and second portions of the polysilicon gate electrode are isolated from one another, only the charge which is on the first polysilicon portion contributes to gate insulating region degradation during plasma etching. After polysilicon gate electrode formation, the first and second portions may be electrically connected by a link. Field effect transistor performance and/or reliability are thereby increased.

11 Claims, 4 Drawing Sheets

BIFURCATED POLYSILICON GATE ELECTRODES AND FABRICATION METHODS

FIELD OF THE INVENTION

This invention relates to integrated circuit semiconductor devices and fabrication methods, and more particularly to integrated circuit field effect transistors and fabrication methods.

BACKGROUND OF THE INVENTION

Integrated circuit field effect transistors and particularly integrated circuit insulated gate field effect transistors, are widely used in microelectronic devices such as logic devices, memory devices and microprocessors. As is well known to those having skill in the art, an insulated gate field effect transistor, often referred to as an MOS transistor, includes spaced-apart source and drain regions in a semiconductor substrate and a gate insulating region between the spaced-apart source and drain regions. Source, drain and gate electrodes contact the source and drain regions and the gate insulating region, respectively. The gate electrode for an integrated circuit field effect transistor is often fabricated from polycrystalline silicon, referred to herein as "polysilicon".

Etching is often used during integrated circuit fabrication. In particular, plasma etching using ionized gases is widely used to fabricate integrated circuit devices. Unfortunately, plasma etching may result in undesired ions being collected in the device which is being etched. The accumulated ions may adversely affect device performance and/or reliability.

For example, when patterning a gate electrode of an integrated circuit field effect transistor, charge generated during plasma etching may accumulate in the transistor. Ions accumulated in this manner may cause Fowler-Nordheim tunneling current to flow through the gate insulating region between the gate electrode and the semiconductor substrate, thereby trapping charge in the gate insulating region. These trapped charges in the gate insulating region may degrade the gate insulating region.

Moreover, as the density of microelectronic devices increases and the feature sizes decrease, the gate insulating region has become thinner. Unfortunately, a thin gate insulating region is even more susceptible to degradation from charge accumulation which is generated during plasma etching.

Attempts have been made to reduce the damage which is induced in the gate insulating region during plasma etching of a metal gate electrode. FIGS. 1A and 1B illustrate a conventional technique for removing charge induced on a gate electrode during plasma etching. Referring to FIG. 1A, a cross-sectional view of an N-channel MOS (NMOS) field effect transistor is illustrated. N-type regions 110 are formed at one face of a P-type substrate 100 to define spaced-apart source and drain regions for the transistor. A gate insulating region 150, often in the form of an oxide such as silicon dioxide, is formed on the substrate 100. During plasma etching to pattern the gate electrode 130, positive charge which is formed on the gate electrode 130 generates a Fowler-Nordheim current in the gate insulating region 150. Negative charges in the gate insulating region increase due to this current, and the threshold voltage of the device also increases. The increased threshold voltage may cause breakdown of the gate insulating region 150, thereby degrading device reliability.

In order to reduce the damage to gate insulating region 150, a diode 120 is connected between the gate electrode 130 and the substrate 100, so that the charge which is formed on the gate electrode 130 during plasma etch patterning is discharged into substrate 100. Metal lead 140 connects the gate electrode 130 to the diode 120, thereby providing a discharge path for discharging the positive charge collected on the gate electrode 130 into the semiconductor substrate through the diode. A schematic illustration of the dissipation of charge through diode 120 is illustrated in FIG. 1B.

Unfortunately, in the NMOS transistor described above, the diode is generally reverse biased. Accordingly, it may be difficult to discharge the gate electrode 130, and degradation of the gate insulating region 150 may still occur.

FIGS. 2A and 2B illustrate a second conventional technique for reducing damage to gate insulating region 150. In FIG. 2A, a cross-sectional representation of a semiconductor substrate is shown. Instead of the diode 120 of FIG. 1, however, a bipolar junction transistor 200 is connected between the gate electrode 130 and the substrate 100. The bipolar junction transistor is turned on by the positive charge which is generated during plasma etching. Accordingly, the gate electrode 130 is connected to the substrate and the charge on the gate electrode is discharged in the substrate. Degradation of the gate insulating region 150 is thereby reduced. FIG. 2B is a schematic diagram of the dissipation of charge through the bipolar junction transistor 200.

The above-described techniques may be used to reduce degradation of the gate oxide during a metal plasma etching process. However, there is still a further need to reduce degradation of the gate insulating regions during plasma etching, especially during plasma etching of a polysilicon gate electrode. There is also a need to reduce degradation of the gate insulating region without requiring separate diodes or transistors for charge dissipation purposes.

SUMMARY OF THE INVENTION

It is therefore an object of the invention to provide an improved integrated circuit field effect transistor having a polysilicon gate electrode, and methods of fabricating same.

It is another object of the invention to provide an integrated circuit field effect transistor having reduced susceptibility to gate insulating region degradation during plasma etching of a polycrystalline silicon gate electrode, and methods of fabricating same.

It is yet another object of the invention to provide a field effect transistor which does not require the use of external devices such as diodes and transistors in order to protect the gate insulating region from degradation during plasma etching of a polycrystalline gate electrode, and methods of fabricating same.

These and other objects are provided, according to the present invention by forming the polysilicon gate electrode of an integrated circuit field effect transistor in two portions which are isolated from one another, for example by electrical insulation. The first portion, referred to herein as a "gate polysilicon portion", is formed on the gate insulating region. The second portion, referred to herein as a "bridging polysilicon portion", is formed on the semiconductor substrate outside the gate insulating region, and is electrically insulated from the first portion. Accordingly, a bifurcated polycrystalline silicon gate electrode is formed. The bifurcated polysilicon gate electrode is preferably formed by plasma etching a layer of polysilicon to define the first and second portions of the polysilicon gate electrode.

Since the first and second portions of the polysilicon gate electrode are isolated from one another, only the charge which is on the gate polysilicon portion contributes to gate insulating region degradation during plasma etching. The charge on the bridging polysilicon portion does not contribute to degradation of the gate oxide because the bridging polysilicon portion is isolated from the gate polysilicon portion.

Moreover, since the gate insulating portion may be made many times smaller than the bridging polysilicon portion, only a small amount of the total charge will be trapped on the gate polysilicon portion during polysilicon etching. A large reduction in gate insulation region degradation during plasma etching is thereby provided. After the bifurcated polysilicon gate is formed using plasma etching, a metal link may be used to electrically connect the two portions, to thereby complete the polysilicon gate electrode.

Stated another way, according to the invention, the polysilicon gate electrode adjacent the gate insulating region is isolated from the polysilicon gate electrode remote from the gate insulating region during fabrication of the polysilicon gate electrode. Accordingly, only charge on the polysilicon gate electrode adjacent the gate insulating region contributes to gate insulating region breakdown during plasma etching. Charge on the polysilicon gate electrode which is remote from the gate insulating region does not contribute to gate insulating region breakdown.

An integrated circuit field effect transistor according to the invention includes a bifurcated polycrystalline gate electrode including a gate polysilicon portion on the gate insulating region and a bridging polysilicon portion on the semiconductor substrate outside the gate insulating region. Linking means is also included for electrically connecting the gate polysilicon portion and the bridging polysilicon portion. The linking means preferably comprises material having electrical conductivity which is different from the gate polysilicon portion and the bridging polysilicon portion, and is most preferably a metal link.

An integrated circuit according to the invention also preferably includes a plurality of conductive lines on the substrate, such as bit lines, word lines, power supply lines or ground lines, which extend along a first direction on the substrate. The bridging polysilicon portion preferably extends on the semiconductor substrate in a second direction which is orthogonal to the first direction. The bridging polysilicon portion includes first and second ends. The first end is electrically connected to the linking means and the second end is electrically connected to one of the conductive lines.

It will be understood by those having skill in the art that when an element is referred to herein as being "on" another element, it may be formed directly on the element or intervening elements may be present. Moreover, the gate polysilicon portion on the gate insulating region may also extend outside the gate insulating region, and the bridging polysilicon portion on the semiconductor substrate outside the gate insulating region may also extend on the gate insulating region.

Accordingly, the bifurcated polysilicon gate electrode isolates the polysilicon gate electrode remote from the gate insulating region from the polysilicon gate electrode adjacent the gate insulating region, to thereby prevent charge which is accumulated on the polycrystalline gate electrode remote from the gate insulating region from degrading the gate insulating region. Field effect transistor performance and/or reliability are thereby increased.

DETAILED DESCRIPTION OF PREFERRED EMBODIMENTS

Figure 1A:
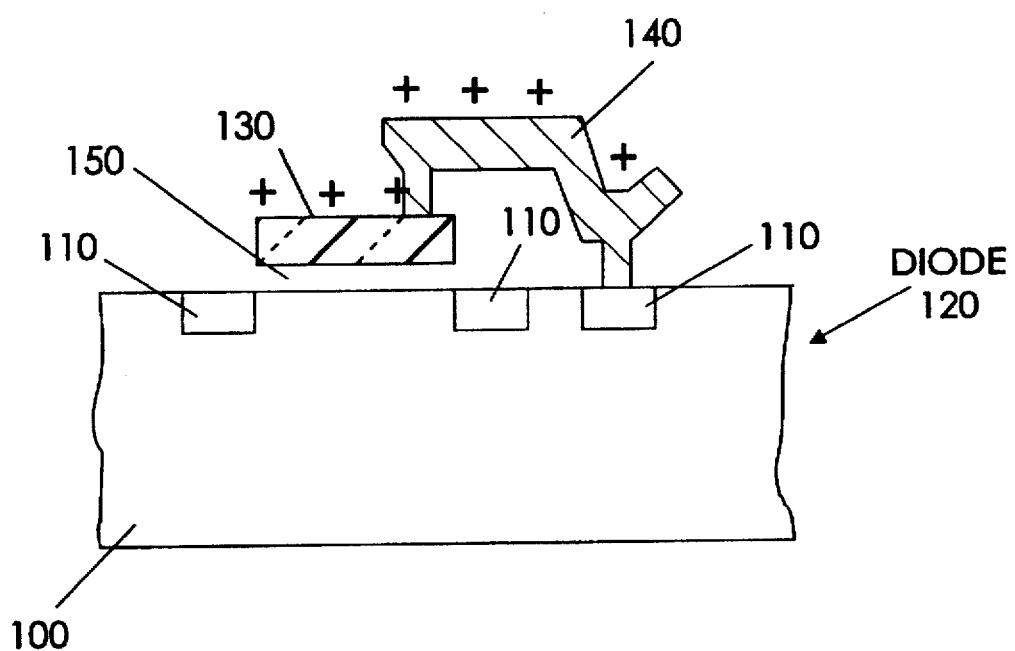
FIG. 1A is a cross-sectional view of a conventional integrated circuit NMOS transistor including a diode which dissipates charge on the gate electrode.
Figure 1B:
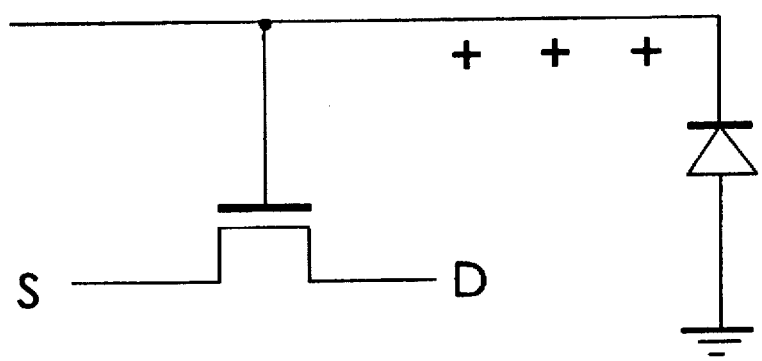
FIG. 1B schematically illustrates the transistor of FIG. 1A.
Figure 2A:
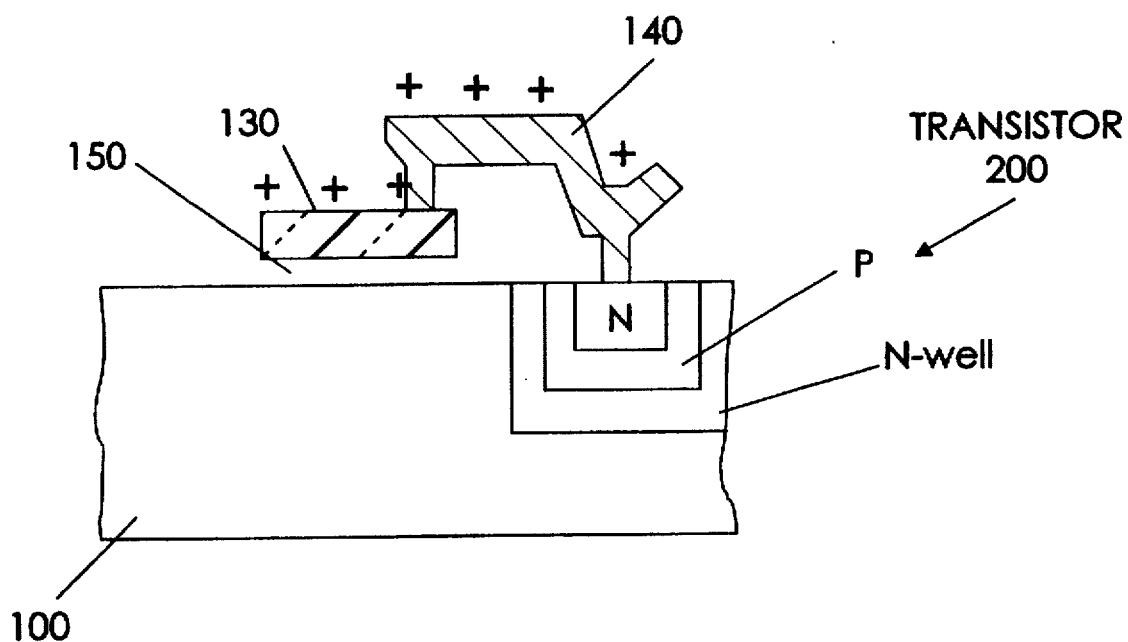
FIG. 2A is a cross-sectional view of a conventional integrated circuit NMOS transistor including a bipolar junction transistor which dissipates charge on the gate electrode.
Figure 2B:
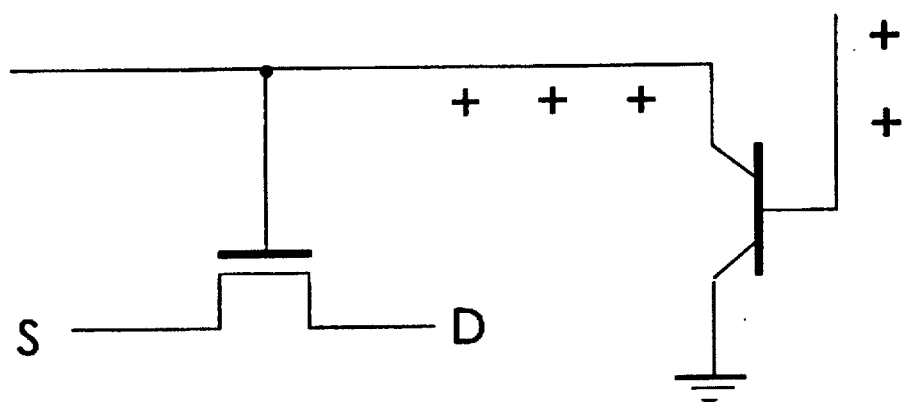
FIG. 2B schematically illustrates the transistor of FIG. 2A.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
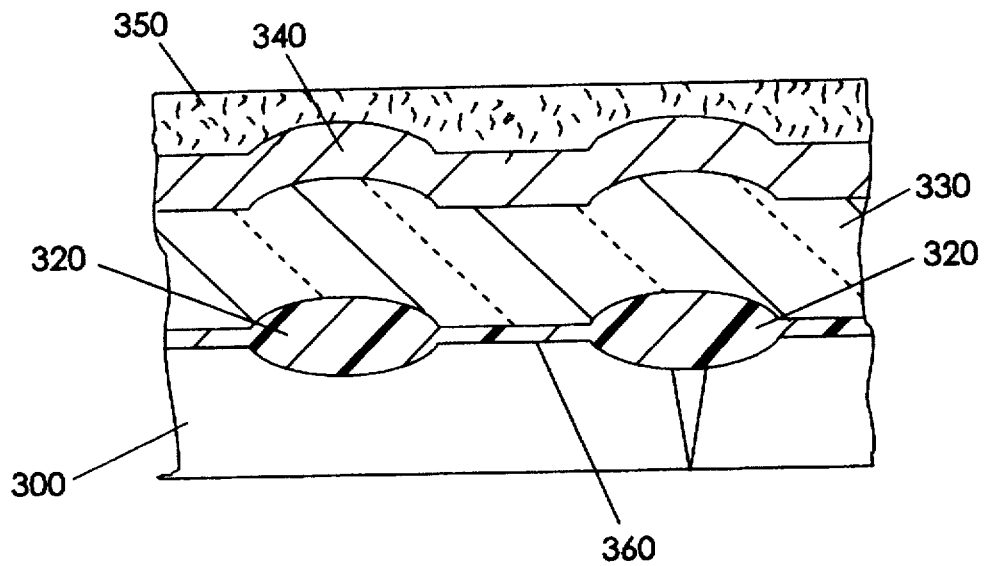
FIG. 3 is a cross-sectional view of a polysilicon gate integrated circuit field effect transistor during an intermediate fabrication step.

Referring now to FIG. 3, a cross-sectional view of a field effect transistor during an intermediate fabrication step is illustrated. As shown in FIG. 3, a polysilicon layer 330 is formed on a field oxide 320 and a gate insulating region such as oxide 360 on a substrate 300 such as a P-type substrate. A layer of tungsten silicide 340 is deposited on the polysilicon layer 330. A photoresist layer 350 is coated on the tungsten silicide layer 340.

Figure 4:
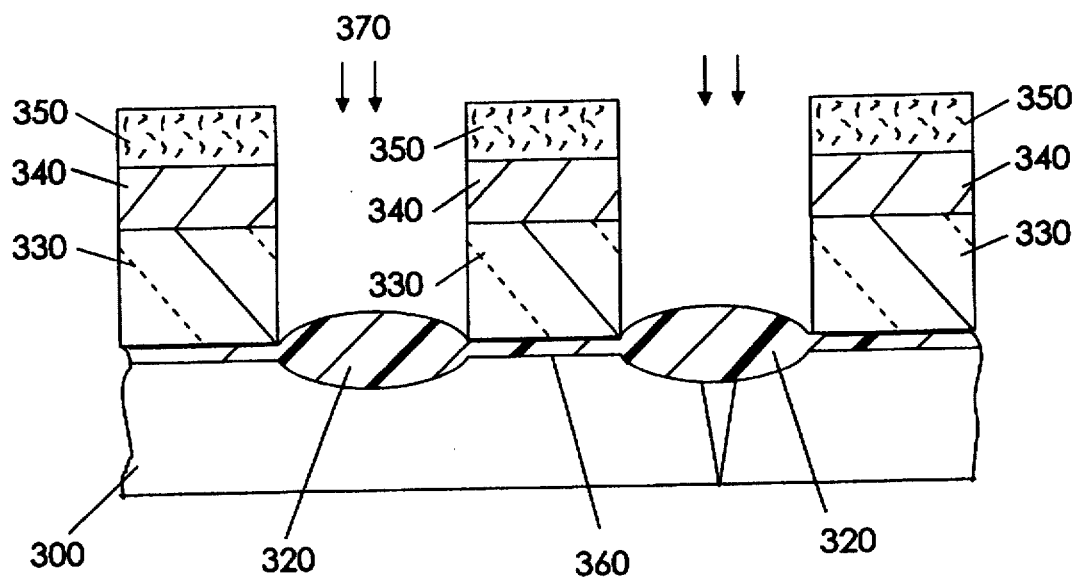
FIG. 4 is a cross-sectional view of the field effect transistor of FIG. 3 during polysilicon gate formation.

Referring now to FIG. 4, a cross-sectional view of the device of FIG. 3 during plasma etching to form a polysilicon gate is illustrated. As shown, plasma 370 is used to etch photoresist layer 350, tungsten silicide layer 340 and polysilicon layer 330. The plasma 370 may have several hundred watts of energy. Accordingly, during plasma etching, charge is collected on the polysilicon gate 330, the tungsten silicide layer 340 and/or the photoresist layer 350. The collected charge may cause current to flow through the gate insulating region 360, thereby causing degradation of the gate insulating region 360.

Figure 5:
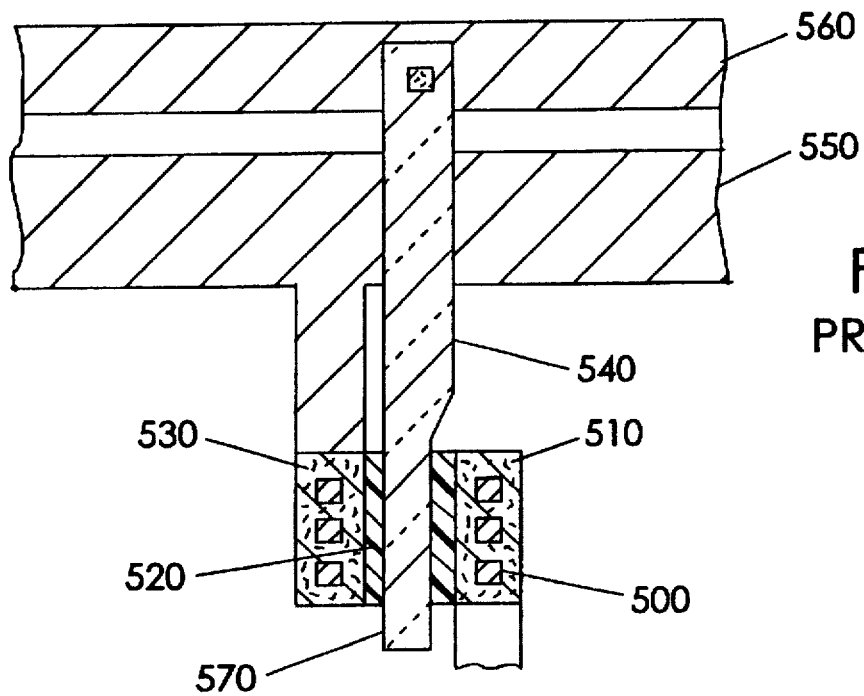
FIG. 5 is a top view of a conventional integrated circuit polysilicon gate field effect transistor.

FIG. 5 illustrates a top view of a conventional integrated circuit field effect transistor including a polysilicon gate. As shown, source region 530 and drain region 510 are formed in a substrate. Source region 530 is connected to a ground line 550 and drain region 510 is connected to a gate of another transistor via line 560 using contacts 500. Polycrystalline silicon gate 540 extends on gate insulating region 520 and outside gate insulating region 520 to electrically connect to line 560. As shown, line 560 extends on the semiconductor substrate orthogonal to the polysilicon gate electrode 540. The hatched region 570 of the polysilicon gate electrode illustrates where plasma damage is generated during polysilicon gate electrode plasma etching. The plasma damage causes degradation of the gate insulating region 520.

Figure 6:
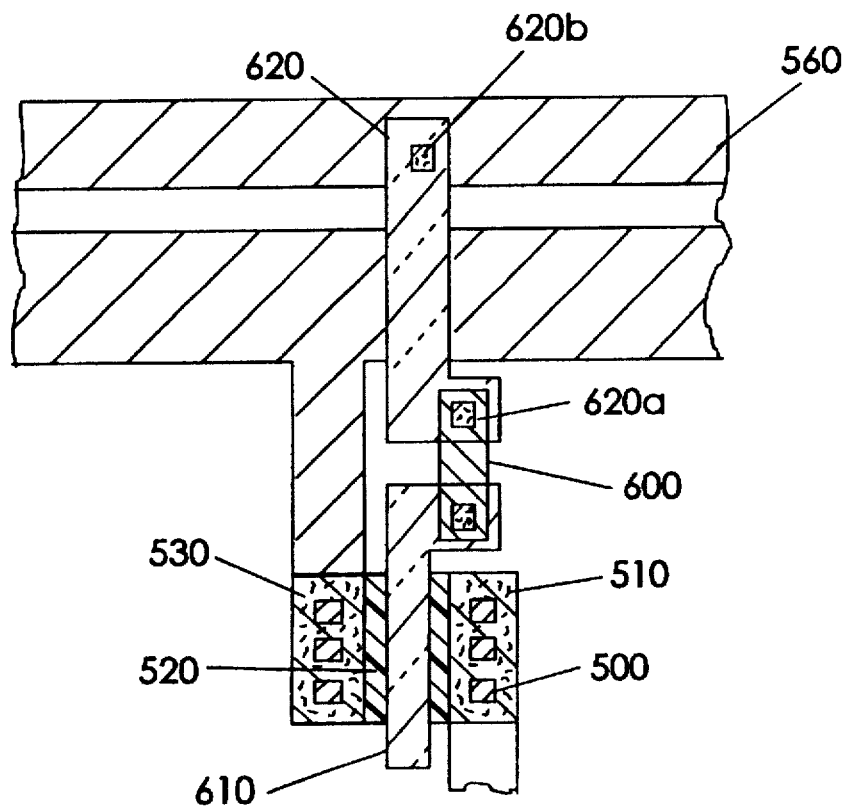
FIG. 6 is a top view of a field effect transistor including a bifurcated polysilicon gate electrode, and a fabrication method therefor, according to the present invention.

FIG. 6 illustrates a top view of a field effect transistor including a bifurcated polysilicon gate electrode, and a fabrication method therefor, according to the present invention. In general, the charge which is collected over the thin gate insulating region 520 is reduced by bifurcating the polycrystalline silicon gate into two portions. A gate polysilicon portion 610 is on the gate insulating region 520, and may also extend beyond the gate insulating region 520 as shown. A bridging polysilicon portion 620 is on the semiconductor substrate outside the gate insulating region 520, and may also extend onto the gate insulating region 520 (not shown).

Accordingly, during plasma etching, the area of the polysilicon gate electrode which can accumulate charge over the gate insulating region 520 is reduced by isolating the two portions 610, 620 of the polysilicon gate electrode from one another. Charge which is accumulated on the bridge polysilicon portion 620 during fabrication is prevented from contributing to gate insulating region degradation because the bridge polysilicon portion 620 is insulated from the gate polysilicon portion 610. Preferably, the length of the gate polysilicon portion 610 is one tenth the length of the bridge polysilicon portion 620. Accordingly, the amount of charge is reduced considerably, and the gate oxide degradation may be reduced considerably.

After fabrication of the bifurcated polysilicon gate electrode, linking means such as a metal link 600 may be formed to electrically connect the gate polysilicon portion 610 and the bridging polysilicon portion 620. The linking means preferably has an electrical conductivity which is different from the gate polysilicon portion 610 and the bridging polysilicon portion 620 and is preferably a metal link 600.

As also shown in FIG. 6, the integrated circuit further includes a plurality of conductive lines 550, 560 on the substrate extending along a first direction (here horizontally). The bridging polysilicon portion 620 on the semiconductor substrate extends in a second direction which is orthogonal to the first direction, here vertically. The bridging polysilicon portion includes first and second ends 620a and 620b, respectively. The first end 620a is electrically connected to the link 600 and the second end 620b is electrically connected to one of the conductive lines 560.

FIG. 6 also illustrates methods of fabricating a polysilicon gate electrode for an integrated circuit field effect transistor, according to the present invention. A polysilicon gate electrode is formed in two portions 610, 620 which are isolated from one another. The first portion 610 extends on the gate insulating region 520 and the second portion extends on the semiconductor substrate outside the gate insulating region 520. As also shown, the two portions are electrically connected using link 600, to thereby form the polysilicon gate electrode.

Accordingly, the polysilicon gate electrode adjacent the gate insulating region is electrically isolated from the polysilicon gate electrode remote from the gate insulating region during fabrication of the polysilicon gate electrode. The polysilicon gate electrode adjacent the gate insulating region is then electrically connected to the polysilicon gate electrode remote from the gate insulating region after fabrication of the polysilicon gate electrode.

By bifurcating the polysilicon gate electrode, the damage induced due to plasma etching is reduced by reducing the charge accumulation in the thin gate insulating region. Accordingly, the shift in threshold voltage due to Fowler-Nordheim current is reduced or eliminated and gate insulating region breakdown is reduced or prevented, thereby increasing device performance and/or reliability.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit field effect transistor comprising:

a semiconductor substrate, including spaced apart source and drain regions and a gate insulating region therebetween;

a bifurcated polycrystalline silicon (polysilicon) gate electrode, including a gate polysilicon portion on said gate insulating region and a bridging polysilicon portion on said semiconductor substrate outside said gate insulating region; and linking means for electrically connecting said gate polysilicon portion and said bridging polysilicon portion, wherein said linking means comprises a metal link.

2. An integrated circuit field effect transistor comprising:

a semiconductor substrate, including spaced apart source and drain regions and a gate insulating region therebetween;

a bifurcated polycrystalline silicon (polysilicon) gate electrode, including a gate polysilicon portion on said gate insulating region and a bridging polysilicon portion on said semiconductor substrate outside said gate insulating region; and linking means for electrically connecting said gate polysilicon portion and said bridging polysilicon portion;

wherein said integrated circuit further includes a plurality of conductive lines on said semiconductor substrate, extending in a first direction, said bridging polysilicon portion extending on said semiconductor substrate outside said gate insulating region in a second direction which is orthogonal to said first direction, said bridging polysilicon portion including first and second ends, said first end being electrically connected to said linking means, and said second end being electrically connected to one of said conductive lines.

3. An integrated circuit polycrystalline silicon (polysilicon) gate electrode which connects a gate insulating region of a field effect transistor to an integrated circuit conductive line outside said gate insulating region, said polysilicon gate electrode comprising:

a gate polysilicon layer on said gate insulating region;

a bridging polysilicon layer outside said gate insulating region, and electronically connected to said conductive line; and a metal link which electrically connects said gate polysilicon layer to said bridging polysilicon layer.

4. An integrated circuit polycrystalline silicon (polysilicon) gate electrode which connects a gate insulating region of a field effect transistor to an integrated circuit conductive line outside said gate insulating region, said polysilicon gate electrode comprising:

a gate polysilicon layer on said gate insulating region;

a bridging polysilicon layer outside said gate insulating region, and electrically connected to said conductive line; and a link which electrically connects said gate polysilicon layer to said bridging polysilicon layer;

wherein said conductive line extends in a first direction and said bridging polysilicon portion extends outside said insulating region in a second direction which is orthogonal to said first direction and includes first and second ends, said first end being electrically connected to said link, and said second end being electrically connected to said conductive line.

5. An integrated circuit polycrystalline silicon (polysilicon) gate electrode which connects a gate insulating region of a field effect transistor to an integrated circuit conductive line outside said gate insulating region, said polysilicon gate electrode comprising:

a gate polysilicon layer adjacent said gate insulating region;

a bridging polysilicon layer remote from said gate insulating region, and electrically connected to said conductive line; and a metal link which electrically connects said gate polysilicon layer to said bridging polysilicon layer.

6. An integrated circuit polycrystalline silicon (polysilicon) gate electrode which connects a gate insulating region of a field effect transistor to an integrated circuit conductive line outside said gate insulating region, said polysilicon gate electrode comprising:

a gate polysilicon layer adjacent said gate insulating region;

a bridging polysilicon layer remote from said gate insulating region, and electrically connected to said conductive line; and a link which electrically connects said gate polysilicon layer to said bridging polysilicon layer;

wherein said conductive line extends in a first direction and said bridging polysilicon portion extends in a second direction which is orthogonal to said first direction and includes first and second ends, said first end being electrically connected to said link, and said second end being electrically connected to said conductive line.

7. An integrated circuit field effect transistor comprising:

a semiconductor substrate, including spaced apart source and drain regions and a gate insulating region therebetween;

a polycrystalline silicon (polysilicon) gate electrode including a first portion adjacent said gate insulating region and a second portion remote from said gate insulating region; and means for electrically insulting said second portion of said polysilicon gate electrode from said first portion of said polysilicon gate electrode during fabrication thereof, to thereby prevent charge which is accumulated on said second portion during fabrication thereof from degrading said gate insulating region.

8. A method of fabricating a polycrystalline silicon (polysilicon) gate electrode for a gate insulating region of an integrated circuit field effect transistor in a semiconductor substrate, comprising the steps of:

forming said polysilicon gate electrode in first and second portions which are electrically isolated from one another, the first portion being formed adjacent said gate insulating region and the second portion being formed remote from said gate insulating region; and electrically connecting said first and second electrically isolated portions to one another, to thereby form said polysilicon gate electrode.

9. A method of fabricating a polycrystalline silicon (polysilicon) gate electrode for a gate insulating region of an integrated circuit field effect transistor in a semiconductor substrate, comprising the steps of:

forming said polysilicon gate electrode in first and second portions which are isolated from one another, the first portion being formed adjacent said gate insulating region, and the second portion being formed remote from said gate insulating region; and electrically connecting said first and second portions to one another, to thereby form said polysilicon gate electrode;

wherein said forming step comprising the steps of:

forming a layer of polysilicon on said semiconductor substrate; and plasma etching said layer of polysilicon to define said polysilicon gate electrode.

10. A method of fabricating a polycrystalline silicon (polysilicon) gate electrode for a gate insulating region of an integrated circuit field effect transistor in a semiconductor substrate, comprising the steps of:

isolating the polysilicon gate electrode adjacent the gate insulating region from the polysilicon gate electrode remote from the gate insulating region during fabrication of the polysilicon gate electrode; and electrically connecting the polysilicon gate electrode adjacent the gate insulating region to the polysilicon gate electrode remote from the gate insulating region after fabrication of the polysilicon gate electrode.

11. A method according to claim 10 wherein said step of isolating comprises the step of electrically insulating the polysilicon gate electrode adjacent the gate insulating region from the polysilicon gate electrode remote from the gate insulating region during fabrication of the polysilicon gate electrode.

* * * * *